United States Patent [19]
Oido et al.

[11] Patent Number: 4,633,032
[45] Date of Patent: Dec. 30, 1986

[54] PACKAGE CONFIGURATION OF SOLAR CELL ELEMENTS

[75] Inventors: Hikofumi Oido, Katano; Yoshitake Hayashi, Kawachinagano; Minoru Yamamoto, Saijyo, all of Japan

[73] Assignee: Matsushita Electric Industrial Co., Ltd., Kadoma, Japan

[21] Appl. No.: 701,192

[22] Filed: Feb. 13, 1985

[30] Foreign Application Priority Data

Feb. 15, 1984 [JP] Japan ................................ 59-26310

[51] Int. Cl.$^4$ ........................................... H01L 31/00
[52] U.S. Cl. .................................... 136/251; 136/259; 250/239; 357/78
[58] Field of Search ................. 136/251, 259; 357/78; 250/239

[56] References Cited

U.S. PATENT DOCUMENTS 2,001,672  5/1935  Carpenter ............................. 338/17
4,231,807  11/1980  Keeling et al. ...................... 136/251
4,433,200  2/1984  Jester et al. ......................... 136/251

FOREIGN PATENT DOCUMENTS

55-55580  4/1980  Japan ................................... 136/260

Primary Examiner—Aaron Weisstuch
Attorney, Agent, or Firm—Wenderoth, Lind & Ponack

[57] ABSTRACT

A package configuration of a solar cell has a glass substrate having a solar cell element formed on the surface opposite to the light-receiving surface thereof, a backplate disposed across an empty space from the surface of the glass substrate opposite to the light receiving surface thereof, a frame connecting the glass substrate and the backplate to each other along the peripheries thereof, a sealing resin layer sealed inside the peripheries of the backplate and the frame so as to isolate the empty space from the atmosphere, a layer of desiccant disposed inside the backplate so as to adsorb moisture penetrating into the empty space, and conductor wires for externally collecting electric energy generated by the solar cell element.

16 Claims, 9 Drawing Figures

PACKAGE CONFIGURATION OF SOLAR CELL ELEMENTS

BACKGROUND OF THE INVENTION

1. Field of the Invention

This invention relates to a package configuration of solar cells, particularly of Group II–VI compound semiconductor solar cells.

2. Description of the Prior Art

Recently, solar energy has been attracting attention as a promising substitute for existing energy sources. Various solar cells for converting radiant energy of sunlight to electric energy, which is more readily usable than any other energy, by virtue of the photoelectric effect of semiconductors have been developed and successfully put to actual uses. Solar cells are classified according to their constitution (crystallographic morphology) broadly under single crystals, polycrystals, and amorphous masses. They are broadly classified according to their material under Group VI elements, Group III–V compounds, and Group II–VI compounds. Among these solar cells, those formed on glass substrates by the screen printing method and the sintering method are capable of conversion efficiency of about 8%. A solar cell made of Group II–VI compound semiconductors forming a heterojunction between an n-type CdS film and a p-type CdTe film is receiving increased attention not only because it permits enlargement of surface area but also because it makes possible good cost reduction and has good mass-producibility.

Figure 1:
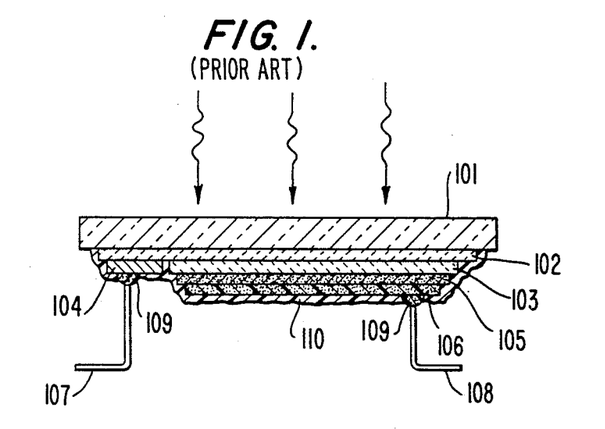
FIG. 1 is a cross-sectional diagram of a prior art Group II–VI compound semiconductor solar cell element.

FIG. 1 illustrates the basic configuration of this type of solar cell. The construction of this solar cell and a process for the production of this cell will be described below with reference to FIG. 1. A substrate 101 is made of ordinary alkali-free borosilicate glass. A sintered CdS film 102 destined to form the n-type material of a p-n heterojunction is obtained by screen printing on the glass substrate 101 a paste prepared by kneading a finely divided CdS powder containing 1 weight % of KCl and 6 weight % of $CdCl_2$ as a fusing agent with a suitable amount of propylene glycol, drying the deposited paste, and firing the dried layer in an atmosphere of nitrogen containing a minute amount of oxygen at a temperature of about 700° C. A sintered CdTe film 103 is obtained by kneading a finely divided CdTe powder with $CdCl_2$ added thereto as a fusing agent and a suitable amount of propylene glycol also added thereto for forming a paste, screen printing the paste selectively on the sintered CdS film 102, drying the deposited paste, and firing the dried layer in an atmosphere of nitrogen at a temperature of about 630° C. Numeral 104 designates an electrode formed on the sintered CdS film 102. This is a negative electrode (Ag-In layer) obtained by screen-printing an In-containing Ag paint and firing the deposited paint at about 490° C. Numeral 105 is a carbon film formed on the sintered CdTe film 103. This is obtained by kneading a graphitic carbon powder containing about 100 ppm of Cu ions with an organic binder for forming a paste, screen-printing the paste, drying the deposited paste, and firing the dried layer in an atmosphere of nitrogen at a temperature of about 300° C. by the printing and firing treatments, the Cu ions in the carbon film are diffused into the sintered CdTe film 103, and the sintered CdTe film acts as an acceptor. Numeral 106 designates a positive electrode (Ag layer) obtained by printing on the carbon film a conductive Ag paste prepared by dispersing a finely divided Ag powder in a synthetic resin such as epoxy resin and curing the deposited paste at about 150° C., thereby forming an ohmic layer on the carbon film. An external conductor 107 issues from the electrode 104 (Ag-In layer) on the sintered CdS film 102 and an external conductor 108 issues from the electrode 106 (Ag layer) on the sintered CdTe film 103. These conductors can be electric wires made of copper and are joined at suitable locations to the respective electrodes with a conductive adhesive agent 109 prepared by dispersing a finely divided Ag powder in a synthetic resin such a epoxy resin. A cell protecting film 110 is provided by applying a thin coating of a synthetic resin such as epoxy resin or polyester resin on the surface of the cell having the foregoing structure for the purpose of protecting the cell surface against injury and providing electrical insulation for the cell. The process so far described is the basic procedure for the production of the CdS/CdTe heterojunction type solar cell by the screen printing technique. This solar cell is finished by being fabricated into the package configuration illustrated in FIG. 2 to be readied for shipment as a commercial product.

Figure 2:
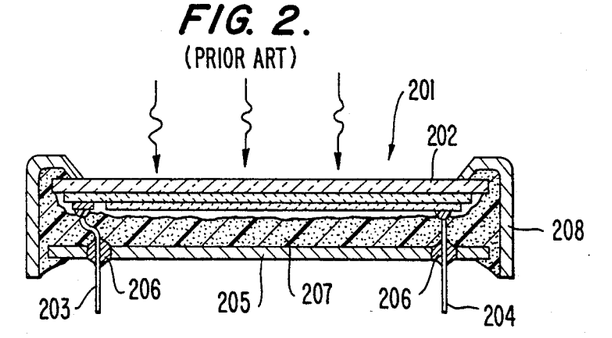
FIG. 2 is a cross-sectional diagram of a conventional package configuration of the solar cell of FIG. 1.

In the diagram of FIG. 2, 201 denotes the solar cell formed on a glass substrate 202 by the above-described printing and firing treatments. (The cross-section of the cell is similar to that of FIG. 1 and, therefore is illustrated here with some details omitted.) Denoted by 203 and 204 are positive and negative external conductor leads respectively connected to the cell. A backplate 205 is provided which is made of a metallic material such as aluminum or stainless steel. This backplate 205 functions as a structural support for mechanically carrying the solar cell which is on the glass substrate. These external conductor leads 203 and 204 are led out of the backplate through electric insulating sleeves 206 such as ceramic insulators extending through the backplate. Numeral 207 denotes a synthetic resin layer having rubbery elasticity filling the space between the solar cell on the glass substrate and the backplate. This resin can be silicone resin, polyurethane resin, copolymer resin of polyethylene and vinyl acetate, or butyral resin, for example. The resin layer which is between the solar cell on the glass substrate and the backplate serves to keep them joined to each other and, at the same time, to prevent the sintered layers of the cell from being penetrated by the humidity in the atmosphere and corrosive gasses to the fullest possible extent, which penetration can cause a change in properties of the cell. Numeral 208 designates a frame which is formed of a metallic material such as aluminum or stainless steel, and which acts as an additional structural support not only to strengthen the integrated unit of the glass substrate and the backplate by mechanically squeezing these members together circumferentially of the unit but also to facilitate the handling of the cell as a commercial product. It is combined with the unit by means of the aforementioned filler of resin material.

Figure 3:
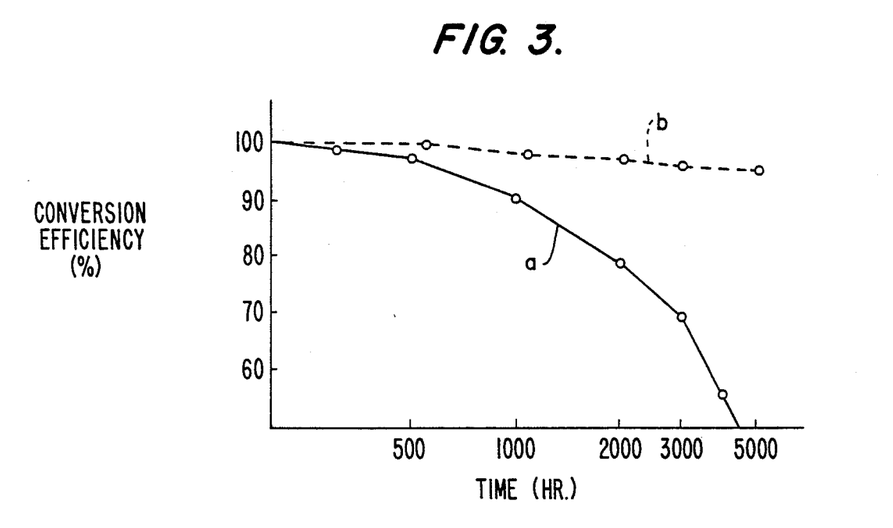
FIG. 3 is a graph showing the characteristic of the change of the conversion efficiency of the solar cell having the package configuration of FIG. 2, with the passage of time.

The solar cell formed of Group II–VI compound semiconductors as illustrated in FIG. 1 and FIG. 2 has to date been evaluated as promising, since it can be produced at low cost and with good mass producibility, because sintered films such as CdS and CdTe can be easily formed on substantially the entire surface of a glass substrate of a desired printable size by repetition of the relatively easy process of printing. While continuing a diligent study devoted to further improving practical solar cells as to quality and reliability and to developing a package configuration of solar cells capable of being mass produced at low cost, the inventors have found that such practical solar cells still suffer from many problems, such as high susceptibility to temperature changes, humidity, and insufficiency of mechanical strength required for commercial product handling. These problems may be summarized as follows:

(1) When a conventional solar cell is left standing outdoors for a long time, it is affected by humidity in the atmosphere and undergoes gradual deterioration of quality. Such a cell requires improvement particularly in properties which are affected by conditions of high temperature and high humidity. FIG. 3 represents a typical characteristic diagram showing the change of conversion efficiency with the passage of time. This diagram was obtained when a solar cell having a conventional package configuration as shown in FIG. 2 was subjected to a typical accelerated durability test in an atmosphere with a varying temperature of 80° to 85° C. and a varying relative humidity (RH) of 90 to 95%. In FIG. 3, the curve (b) represents the characteristic of conversion efficiency obtained when the sample was left standing in a dry atmosphere at 80° to 85° C. and the curve (a) the characteristic of conversion efficiency obtained when the sample was left standing in an atmosphere of 90 to 95% RH at 80° to 85° C. It is noted from the characteristic curves that the solar cell is stable with respect to the temperature, but it is susceptible of deterioration under the influence of humidity. Thus, for the solar cell to be suitable for practical use, this susceptibility to deterioration due to humidity must be overcome by some means or other.

(2) When the conventional solar cell is exposed to an abrupt change in external temperature, the difference between the thermal expansion coefficients of the solar cell element and the interposed layer of resin give rise to strain in the boundary between the solar cell and the interposed layer of resin, which strain can cause cracks in the surfaces of the sintered films of the cell and induce layer separation. Prevention of this deficiency necessitates selection of a proper material for the interposed layer and adoption of a method of incorporation of the layer.

(3) The glass substrate in the cell is required to be protected from such unwanted external forces as bending and twisting which occur during the handling of the solar cell as a commercial product. This can be done by improving the mechanical strength of the backplate and the frame. However, this improvement in mechanical strength should not add any weight or visible dimensions to the cell.

(4) To withstand an abnormal surge of current, such as a bolt of lightening, the cell and the backplate are required to possess a high breakdown voltage. In actual service, the cell should be able to withstand a surge voltage which exceeds 2 KV.

(5) The package should be so constructed that even when the glass substrate is broken, CdS, CdTe and other substances which are possible causes for environmental pollution will be prevented from being scattered from the housing.

(6) The solar cell is required to be constructed so that the production thereof can be easily automated for reducing the cost and enhancing mass producibility.

SUMMARY OF THE INVENTION

An object of this invention is to eliminate all the aforementioned problems and provide a novel package configuration of a solar cell which gives highly reliable protection to the solar cell and thereby enables the solar cell to convert the radiant energy of sunlight with high efficiency and withstand harsh conditions of nature over a long period of time and which can be constructed at low cost and which has high mass producibility, and which has a reduced size and weight.

To accomplish this object, according to the present invention, there is provided a package configuration of a solar cell which comprises in combination: a glass substrate having a solar cell element formed on the surface opposite to the light-receiving surface thereof, a backplate opposed to the solar cell element across an empty space from the surface of the glass substrate opposite to the light receiving surface thereof, a frame connecting the glass substrate and the backplate to each other along the peripheries thereof, an encapsulating resin layer inside the peripheries of the backplate and the frame so as to isolate the empty space from the ambient atmosphere, a layer of desiccant disposed inside the backplate so as to adsorb any moisture which may penetrate into the empty space, and conductors for externally collecting electric energy generated by the solar cell element.

As the desiccant for the layer of desiccant, a material which has high hygroscopicity over a wide range of temperatures is preferable. A so-called molecular sieve, which is a crystalline zeolite obtained by hydrolytically expelling water of crystallization from hydrated metal salts of synthetic crystalline aluminosilicate ($M_2/nO.Al_2O_3.xSiO_2.yH_2O$, wherein M denotes a metallic cation, n denotes the valency of the cation, and x and y each denotes a coefficient), can advantageously be used as the desiccant.

As the material for the encapsulation resin there can be used a material which exhibits cohesive force high enough to adhere powerfully to the glass substrate and the backplate and which also possesses low permeability to moisture. Hot melt butyl can be effectively used as the sealing material.

It is desirable that the backplate be formed of a thin metallic sheet in the shape of a box provided on the bottom side thereof with recesses to hold the desiccant. In other words, the backplate is required to have a structure permitting formation of a layer of desiccant in the recesses. In this case, the recesses each having a lid of synthetic resin in the openings thereof opening into the space, which lid is adapted to prevent the desiccant from flowing out of the recesses and landing on and adhering to parts which should not have extraneous matter thereon. The lids of synthetic resin film have small holes therein to permit passage of the mixture from the empty space into the layer of desiccant inside the recesses. It is also desirable that the backplate have the peripheral edge thereof folded back in the shape of the letter J so that it can be easily and accurately connected to the frame which is also formed in the shape of the letter J.

The conductors are preferably embedded in the encapsulating resin inside the package before they extend out of the package. In this construction, they fulfill their function advantageously because any external force exerted on the conductors is prevented from affecting the points of connection between the conductors and the solar cell element.

The above and other objects, features, and advantages of the present invention will become apparent from the further disclosure of this invention in the following detailed description of a preferred embodiment, with reference to the accompanying drawings.

DESCRIPTION OF THE PREFERRED EMBODIMENT

Figure 5:
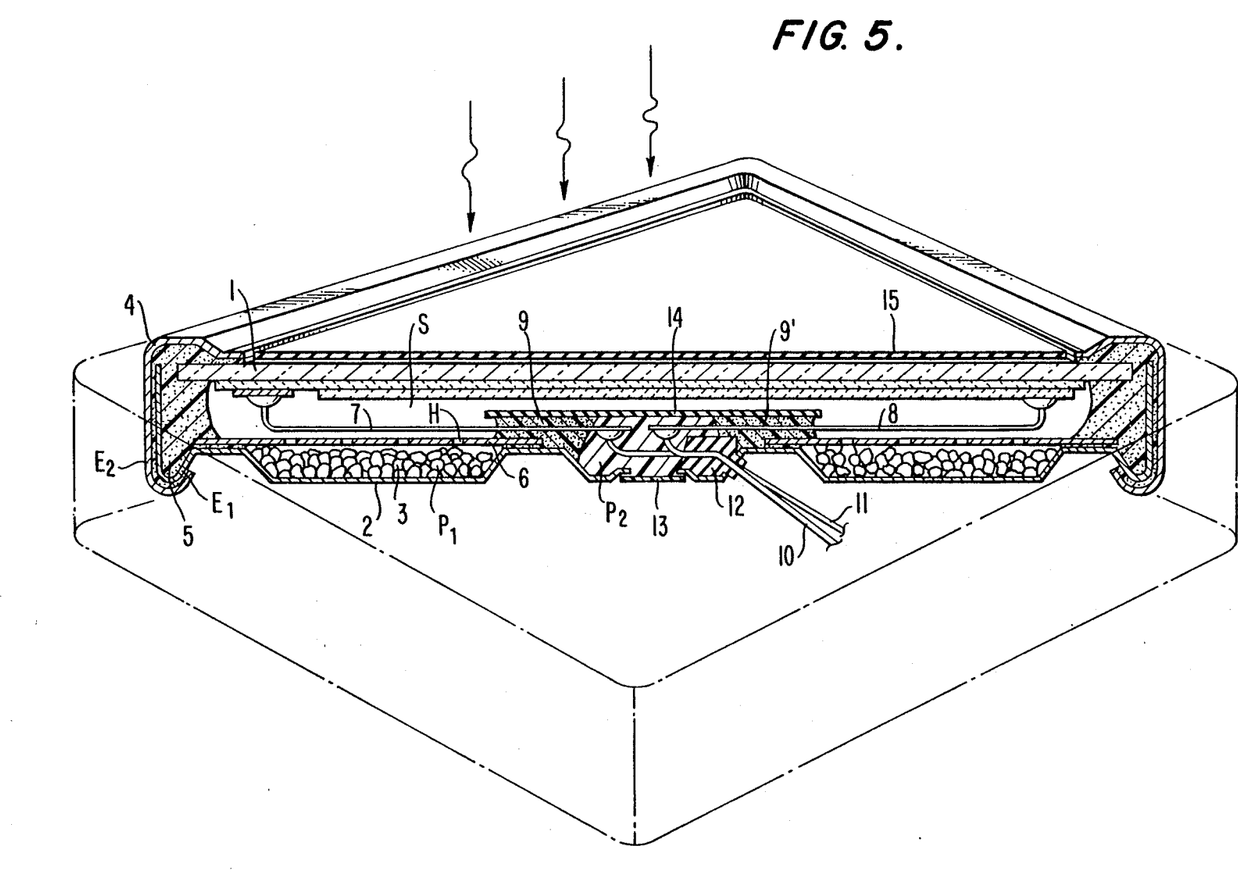
FIG. 5 is a cross-sectional diagram of a typical package configuration of a solar cell according to one embodiment of the present invention.

The basic package configuration of the present invention is illustrated in cross section in FIG. 5. The basic features of the package configuration will be described in detail below with reference to FIG. 5.

The first basic feature is the provision of a layer of empty space S between a glass substrate 1 having a conventional solar cell element C formed thereon (the details of the cross-section of the solar cell element are omitted from the drawing) and a backplate 2, a frame 4 therearound, a layer of desiccant filling the empty space S, which desiccant can be a so-called molecular sieve 3 obtained by thermally removing water of crystallization from hydrated metal salts of synthetic crystalline aluminosilicate ($M_{2/n}O \cdot Al_2O_3 \cdot xSiO_2 \cdot yH_2O$, wherein M denotes a metallic cation, n denotes the valency of the cation, and x and y each denote a coefficient) and formed into pellets 1 to 2 mm in diameter, and a synthetic encapsulating resin seal 5 in the frame around the periphery of the cell for sealing the molecular sieve tightly in the empty space S and forming an integral composite of the glass substrate 1, the backplate 2, the frame 4, and the synthetic resin 5. The molecular sieve which has a great ability to take up water molecules adsorbs the moisture penetrating through the seal 5 of synthetic encapsulating resin 5 thereby protecting the solar cell element and improving the resistance of the overall cell to moisture.

Figure 4:
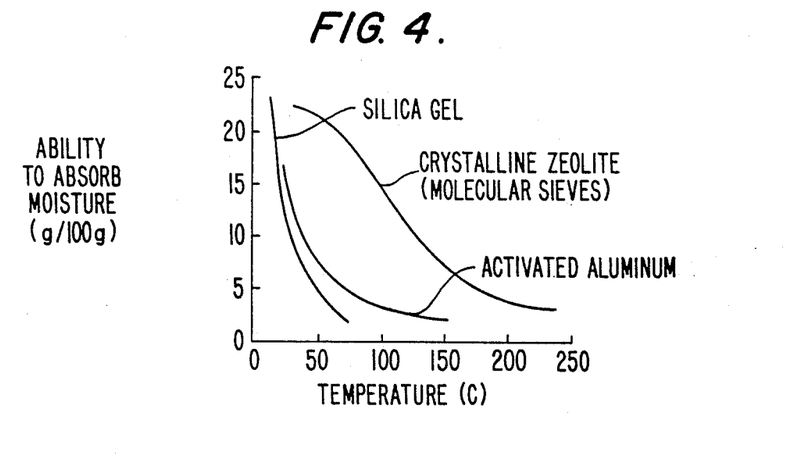
FIG. 4 is a graph showing the change of hygroscopicity of a typical desiccant as a function of temperature.

FIG. 4 is a diagram showing the ability of the molecular sieve to adsorb moisture. The molecular sieve is one kind of desiccant similar to silica gel and activated alumina which are in common use. However, in an atmosphere of high temperature, the molecular sieves has a good ability for adsorption which is not found in any of the other desiccants. This is because the molecular sieve, which has been thermally deprived of water of crystallization as described above, possesses cavities left after the removal of water of crystallization and these cavities are capable of adsorbing on the inner walls thereof molecules of effective diameters ranging from 3 to 10 Å, such as the molecules of water and, additionally, molecules of ammonia, hydrogen sulfide, alcohol, and benzene. The molecular sieves further are capable of adsorbing gaseous substances in addition to the moisture in the atmosphere, which gaseous substances, when they adhere to the surface of the cell element, cause deterioration of the properties thereof. The inventors have succeeded in adapting for actual use the molecular sieve produced by Union Showa Co., Ltd. and marketed under product codes of 3A, 4A, and 14A.

The second feature, which is closely related to the first feature, is the provision of the seal 5 of encapsulating resin around the edge portions of the glass substrate 1 and the backplate 2 and joining the glass substrate and the backplate so as to form the empty space S instead of completely filling the space between the solar cell element 1 formed on the glass substrate and the backplate with the synthetic encapsulating resin material as is done in the prior art of FIG. 2. As the material for this synthetic encapsulating resin, so-called hot melt butyl rubber, which is formed preponderantly of polyisobutylene resin and which adheres well to the glass substrate and the backplate, can be used. The inventors have tested the principal materials conventionally used as encapsulating resin and the hot melt butyl rubber with respect to permeability to moisture (steam). The results are shown in Table 1.

TABLE 1

| Encapsulating Material | Silicone | Polyvinyl butyral | Polyurethane | Polyethylene vinyl acetate copolymer | Hot melt butyl |
|---|---|---|---|---|---|
| Permeability to steam | 0.4–1.6 | 700 | 0.4–1.6 | 210 | 0.02–0.04 |

From the results, it is noted that the hot melt butyl rubber is superior to all the other materials for use as the encapsulating resin.

Due to this low permeability to moisture, the hot melt butyl rubber which surrounds the empty space has the same effect in intercepting moisture as the conventional encapsulating resin filling the entire empty space. The true aim of the second feature of this invention resides not in minimizing the amount of material for the encapsulating resin, but in preventing the moisture and deleterious gaseous elements from penetrating through the encapsulating resin of the solar cell element and instead being led into the empty space, thereby enabling the molecular sieve to adsorb these substances which would otherwise be deposited on the surface of the conventional solar cell element. Thus there is created and preserved a clean and particularly moistureless empty space which prevents deterioration of the solar cell element which might otherwise occur due to adsorption of moisture and enabling it to function to its maximum effect.

Moreover, due to the provision of this empty space S, the strain generated in the boundary between the solar cell element and the layer of encapsulating resin in the conventional solar cell configuration and which is due to the difference in thermal expansion coefficients arising from the changes of temperature repeated over a protracted period of time, and which inflicts damage on the solar cell element in the conventional configuration, is avoided.

The third feature is the provision of a thin sheet of a metallic material such as stainless steel or aluminum with a thickness of 0.2 to 0.5 mm for the backplate 2 and mechanically forming this thin metallic sheet into a box-shaped structure provided at a plurality of positions with recesses $P_1$ for holding the aforementioned molecular sieve. On the surface of the backplate 2 opposed to the solar cell element is adhered by means of a suitable synthetic resin adhesive agent an electrically insulating resin film 6, such as a polyethylene terephthalate resin (PET) film having a dielectric breakdown strength of about 30 KV/mmt and 50 to 100 μm thick, for increasing the breakdown voltage between the solar cell element 1 on the glass substrate and the backplate 2 formed of the metallic sheet. At the same time, the resin film 6 functions as a lid for covering the openings of the recesses to prevent the molecular sieve in the recesses from coming out of the recesses and landing on parts which will be adversely affected by such extraneous substance. The PET film 6 is provided only at the portions corresponding to the recesses with holes H of a size small enough to prevent the molecular sieve from flowing into the empty space S. The molecular sieve in the recesses adsorbs unwanted gas components from the empty space S through these holes H and prevents moisture from accumulating in the empty space S. The box-shaped backplate will be described more fully later as the fourth feature. The end portions of this backplate are formed into a cross-section having the shape of the letter J. A recess serving to guide the external conductor leads 10 and 11, which will be described more fully later as the fifth feature, is similarly shaped by pressing. These parts are effectively shaped all at once by a mechanical press.

The fourth feature is the combining of the box-shaped backplate and the glass substrate having the solar cell formed thereon into an integral unit with the hot melt butyl rubber and attaching to the integral unit the frame 4 which is fabricated separately. The end portion $E_2$ of the cross-sectional shape of this frame is shaped so that it can be folded along the end portion $E_1$ of the cross-section of the backplate which is in the shape of the letter J and then squeezed against the end portion $E_1$. As the material for the frame, a sheet of aluminum or stainless steel 0.3 to 0.5 mm thick is used, similar to the backplate. The squeezing mentioned above is performed along the entire circumference of the J-shaped edge of the box-shaped backplate by the use of a mechanical press using a die as shown in an enlarged scale in FIG. 6.

Figure 6:
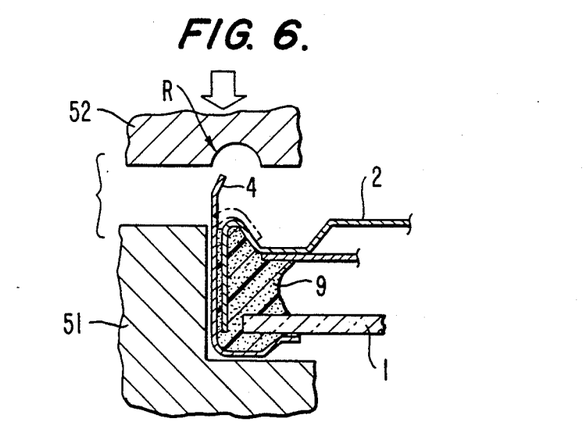
FIG. 6 is an enlarged cross-sectional diagram of the edge portion of a typical package configuration of a solar cell according to the embodiment of FIG. 5.

In FIG. 6, 51 denotes a lower metal die, 52 an upper metal die, 1 the glass substrate having the solar cell formed thereon, 2 the backplate, 4 the frame, and 9 the hot melt butyl rubber. As seen clearly from FIG. 6, when the upper metal die is pressed down in the direction indicated by the arrow, the edge portion of the frame is folded along the upper metal die R and squeezed along the backplate. In contrast to the conventional package of FIG. 2 in which the glass substrate, the backplate, and the frame are combined into an integral unit by the encapsulating resin, the present invention is characterized by forming a configuration of high strength from a thin and light metallic sheet by squeezing the frame in the manner illustrated in FIG. 6 for the construction of this invention.

The fifth feature is the provision of a construction in which the conductor leads 7 and 8 originating respectively at the negative electrode (Ag-In layer) and the positive electrode (Ag layer) extend out of the package. Prior to the formation of the package of the present invention, the hot melt butyl rubber is used to preclude the otherwise possible permeation of moisture (the second feature). The configuration of the present invention is provided by causing the conductor leads 7 and 8 to be embedded in the layer of the hot melt butyl rubber where they extend out of the package. Thus, these conductor leads are buried in the layer of the hot melt butyl immediately prior to the point where they extend away from the package, so that the moisture attempting to enter the package by flowing along the surface of the conductor leads is blocked by the layer of the hot melt butyl.

To be specific, as illustrated in FIG. 5, the external conductor leads 7 and 8 are buried partially where they extend in the longitudinal direction in the layers 9 and 9' of hot melt butyl rubber. They then extend into another recess $P_2$ (hereinafter referred to as a "terminal recess") formed in the backplate and which has an open mouth formed in the bottom side thereof, and are joined as by soldering to electric lead wires 10 and 11 sheathed in a coating of vinyl chloride, polyethylene, or silicone resin so as to withstand outdoor service as desired, and finally extend out of the backplate through an insulating bushing 12 in the terminal recess. This insulating bushing is molded of epoxy resin or polyester resin so as to increase the electrical insulating property of the conductor leads with respect to the terminal recess. Optionally, the conductor leads 7 and 8 can extend directly through the insulating bushing and out of the backplate instead of being soldered to the electric lead wires 10 and 11 en route.

There is one more important part which is effective when added to the above described fifth feature. This is an insulating film 14 of PET or polyimide resin having low permeability to moisture and good electrical insulating properties and measuring 50 to 100 μm in thickness. As illustrated in FIG. 5, this insulating film 14 is disposed so as to fully cover the upper opening of the terminal recess as viewed from the side of the solar cell element formed on the glass substrate, and is then laminated on the upper side of the backplate through the medium of the filler layer of hot melt butyl rubber. This insulating film 14, coupled with the encapsulating resin of hot melt butyl rubber, serves to preclude the entry of moisture through the terminal recess. Further, the laminated film of good electrical insulating properties, similar to the insulating film laminated on the backplate, functions to provide electrical insulation between the solar cell element and the backplate opposed thereto and, at the same time, enables the empty space S to be formed evenly throughout its entire extent.

During assembly after the electrical lead wires 10 and 11 are drawn out of the backplate through the bushing 12 in the terminal recess, the empty part $P_2$ of the terminal recess is filled with hot melt butyl rubber through the open mouth, and the mouth is closed by a lid 13 of the same material as the backplate attached fast thereto by a synthetic resin adhesive agent such as epoxy resin. Since this empty part $P_2$ is not open to the surface of the solar cell element and also since the electrical lead wires are already buried in the layer of hot melt butyl, a synthetic resin such as polymerization curing type liquid epoxy resin or polyurethane resin can be injected into the empty part to fill it up. This filling of the empty part $P_2$ with the synthetic resin strengthens anchoring of the ends of the lead wires which extend out of the backplate so that even when a powerful external pull is exerted on the external lead wires, no unwanted force is conveyed to the portions of the conductor leads joined by the Ag paste to the solar cell element. Thus, the electrical lead wires can be secured sufficiently well to withstand forces normally experienced during the course of actual use.

The sixth feature is the provision of means for protection against impacts inflicted accidentally upon the cell. When the solar cell is dropped or when small pebbles blown up in a storm strike the solar cell, there is a fair possibility that the glass substrate will break and the sintered films containing heavy metal components such as CdS and CdTe will burst and fly in all directions. When the scattered fragments are not completely recovered, the remaining fragments constitute a possible source of environmental pollution. The fragments of glass may fly in all directions and constitute a source of injury. The means for protection against such impacts is a protective film superposed on the glass surface exposed to the incoming sunlight and secured by a suitable synthetic resin adhesive agent. The protective film 15 can be a transparent synthetic resin such as silicone, polysulfone, or polyester which has sufficient permeability to light and high weatherability to avoid discoloration or embrittlement otherwise caused by the ultraviolet component of sunlight. This protective film 15 should have a thickness in the range of about 50 to 100 $\mu$m. Because of the presence of this film, the possibility of the contents of the package bursting and being sent flying in all directions outside the package when the glass substrate is accidentally broken is precluded. In an experiment conducted by the inventors, when a polyester film 70 $\mu$m thick was applied to the glass substrate and a steel sphere 30 mm in diameter held 1 m directly above the glass substrate was dropped onto the glass substrate, the glass substrate was broken but the film amply fulfilled its function of preventing the fragments of glass from being scattered.

The basic features of the construction of the present invention have been described in detail above. A commercial product using the features of the construction described above will be described in detail in connection with FIGS. 7(A) and 7(B).

Figure 7A:
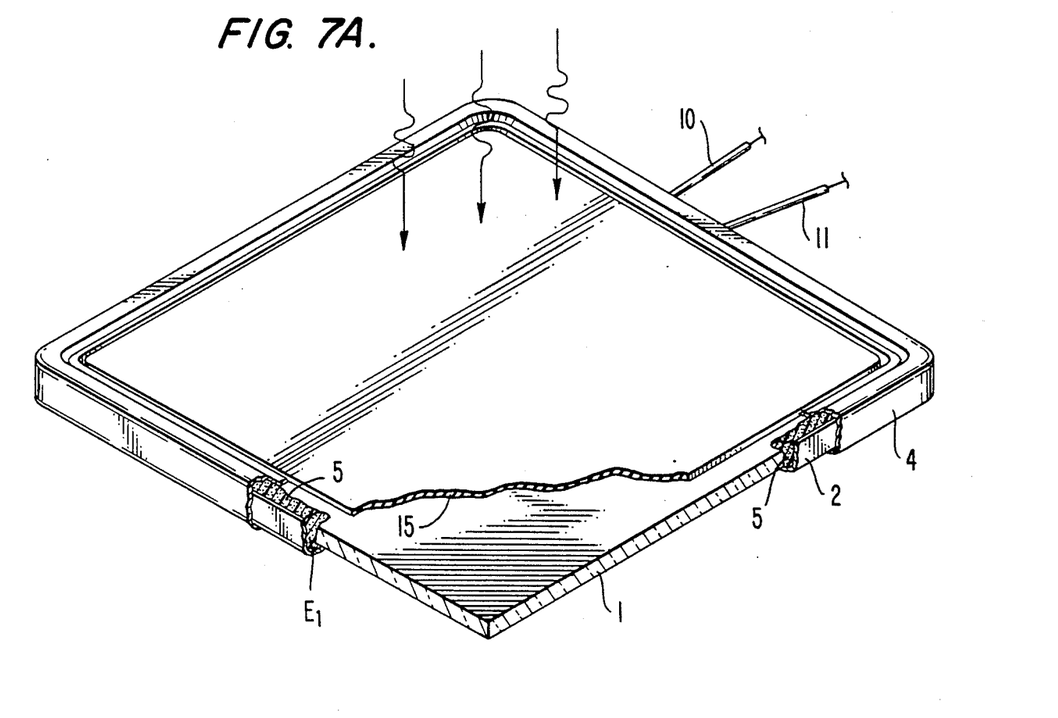
FIG. 7(A) is a partially cut away perspective view of the package configuration of the solar cell according to a further embodiment of this invention, as seen from the front side.
Figure 7B:
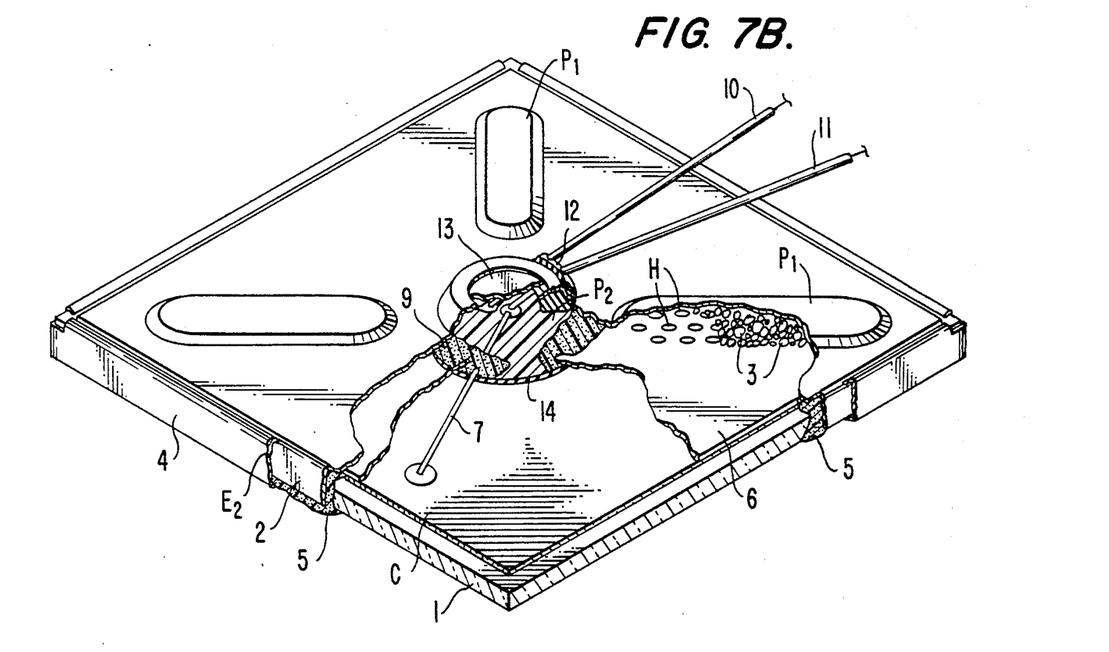
FIG. 7(B) is a partially cut away perspective view of the package configuration of FIG. 7(A), as seen from the rear side.

FIG. 7(A) is a schematic perspective view as seen from the side exposed to the incoming sunlight and FIG. 7(B) is a schematic perspective view as seen from the rear side. The designation of the parts shown in the diagrams are the same as those of the basic elements of construction shown in FIG. 5 and, naturally, the parts have identical functions. In FIGS. 7(A) and 7(B), 1 denotes the glass substrate having a solar cell element (illustrated as a flat plate) C formed thereon, 2 a box-shaped backplate, $E_1$ a J-shaped groove edge part of the backplate, 3 the molecular sieve sealed in a recess $P_1$ in the backplate, 4 a frame, $E_2$ an end part of the frame, 5 hot melt butyl rubber placed in the J-shaped groove edge part of the backplate, 6 an electrical insulation layer (resin film) laminated on the backplate for the purpose of electrically insulating the solar cell side surface of the glass substrate from the backplate and serving as a lid for sealing the molecular sieve in the recess, 7 an external conductor lead, 9 an encapsulating resin layer of hot melt butyl rubber having the external electric lead wires embedded therein, 10 and 11 each external electric lead wires joined by soldering to the conductor leads inside the terminal recess $P_2$ of the backplate, 12 an insulating bushing, 13 a lid to seal the opening in the terminal recess after the recess has been filled with hot melt butyl rubber (omitted in FIG. 7(B)), 14 an insulating layer (resin film) serving to prevent entry of moisture from the terminal recess and additionally serving the same function as the electrical insulating layer 6, and 15 a transparent protective film on the surface of the glass substrate exposed to the incoming sunlight and intended to prevent scattering of fragments of glass when the glass substrate is accidentally broken.

The parts described above make up the commercial embodiment of the solar cell package. Such a solar cell package having a solar cell element formed on a glass substrate having a surface area of 300×300 $mm^2$ and a thickness of 3 mm is a thin light-weight version having a surface area of about 310×310 $mm^2$ and a thickness of 10 mm and weighing about 1 kg.

The features and functions of the construction of the present invention have been fully described above. The improved effects brought about by the package configuration in which these features are combined are summarized below.

Figure 8:
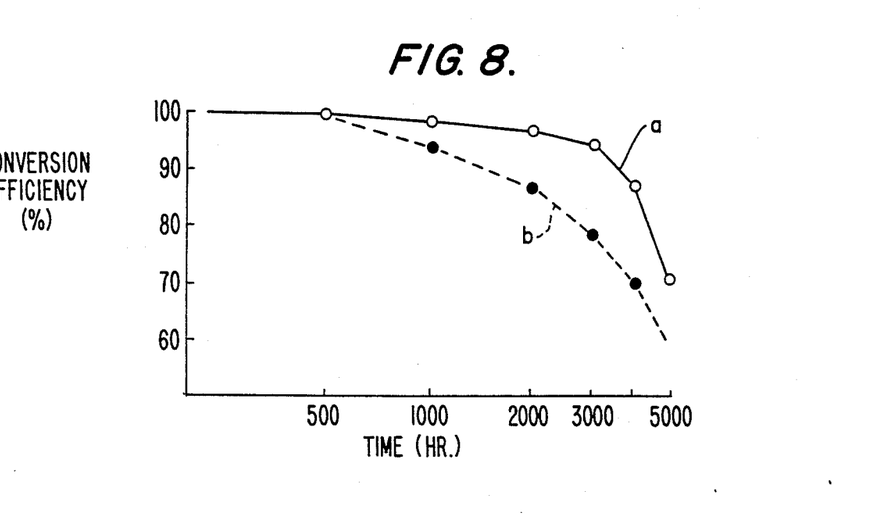
FIG. 8 is a graph showing the characteristic of the change of the conversion efficiency of a solar cell having a package configuration according to the present invention with the passage of time.

(1) The most conspicuous effect of the presence of the molecular sieve can be depicted as shown in FIG. 8. Comparison of the data of this graph with those of FIG. 3, which are the results of the accelerated durability test conducted in an atmosphere of 80° to 85° C. and 90 to 95% RH, clearly reveals that the molecular sieve tightly contained in the package minimizes the change of properties due to high temperature and high humidity and cause the cell performance to be retained stably for a protracted period. This is due to the synergism of the use of the hot melt butyl rubber as the encapsulating resin and the formation of the empty space with the package. When the same commercial product without the inclusion of the molecular sieve is tested under the same conditions of high temperature and high humidity, it retains properties more stably than the conventional package. FIG. 8(a) represents the results for the finished product filled with the molecular sieve and FIG. 8(b) the results for the package without the inclusion of the molecular sieve.

(2) The hot melt butyl rubber possesses good adhesive properties and elasticity due to its great cohesive strength over a wide range of working temperatures. Even when it is used in joining the glass substrate, the metallic backplate, and the frame, i.e. materials having different expansion coefficients, it adsorbs the mechanical strains caused during changes of temperature. Moreover, it need be used only in the edge portions of the package because it has a low hygroscopic coefficient. The use of such hot melt butyl rubber, therefore, permits economization of material and reduction of product cost as well. During the placement of the hot melt butyl rubber in the package, no special treatment is needed such as curing. The package configuration utilizing this hot melt butyl rubber, therefore, has good mass producibility.

(3) In the package configuration of this invention, the backplate is formed in the shape of a box and it is tightly combined with the glass substrate with the aid of the frame. A package configuration of light weight and high strength, therefore, can be provided even when the backplate and the frame are formed of a thin metallic material such as aluminum or stainless steel. Particularly, the backplate of thin metallic sheet can have a proper J-shaped groove and recesses formed therein by a mechanical press. The package configuration, therefore, is not subjected to twists and bends due to the impacts exerted during the fabrication. This principle applies to the frame. The configuration in which the frame is joined intimately to the glass substrate is notably different from the conventional package in which union of parts relies primarily on the synthetic resin material.

(4) Although the backplate is made of a metallic material, it has the resin film of good electrical insulating properties laminated on the inner surface thereof. This lamination, coupled with the formation of the empty space between the solar cell element and the backplate, confers high surge voltage capability upon the package configuration.

(5) Regarding the connection of the external electrical lead wires to the interior of the package, the problem that moisture is liable to find its way into the package by flowing along the boundary of the external electrical lead wires is overcome by first embedding the wires under the layer of hot melt butyl rubber and then allowing them to extend from the interior of the package. Further, the insulation bushing adapted to hold the wires doubly ensures prevention of the entry of moisture into the package and impart high tensile strength to the package configuration.

(6) The protective film of synthetic resin having high permeability to light is laminated onto the surface of the glass substrate exposed to the incoming sunlight. This lamination completes a tightly closed housing for the package so that even when the glass substrate is accidentally damaged, the heavy metal components, possible sources for environmental pollution, are prevented from being scattered out of the package.

Due to the package configuration contemplated by this invention as described above, the solar cell formed by depositing Group II-VI compound semiconductors on the glass substrate by screen printing and firing makes possible an increase of surface area at low cost and with high mass producibility. The invention, therefore, has great economic advantages.

Although this invention has been described chiefly with reference to the package configuration of a solar cell using Group II-VI compound semiconductors, it can be applied to a package configuration for other solar cells using a single crystal, polycrystal, or an amorphous mass of Group IV elements or Group III-V compounds as well.

What is claimed is:

1. A package configuration of a solar cell, comprising in combination:
   a glass substrate having a first surface adapted to be exposed to incoming sunlight;
   a solar cell element formed on a second surface opposite said first surface;
   a backplate in spaced opposed relationship to said second surface and defining an empty space between said backplate and said second surface of said glass substrate;
   a frame connecting said glass substrate and said backplate at the peripheral portions thereof;
   a sealing resin layer sealed around the inside of said frame and sealed between the peripheral portions of said backplate and said glass substrate and extending around the periphery of said empty space for isolating said empty space from the surrounding atmosphere;
   a layer of desiccant disposed on said backplate and having a surface exposed to said empty space for adsorbing moisture which may penetrate said package configuration and enter said empty space; and
   electrically conductive wires connected to said solar cell element and extending to the outside of said solar cell for outputting electric energy generated by said solar cell element.

2. The package configuration according to claim 1 wherein said layer of desiccant is a crystalline zeolite obtained by thermally removing water of crystallization of a hydrated metal salt of synthetic crystalline aluminosilicate of the formula $M_{2/n}O.Al_2O_3.xSiO_2.yH_2O$, wherein M is a metallic cation, n is the valency of the cation, and each of x and y is a coefficient.

3. The package configuration according to claim 1, wherein said layer of sealing resin is hot melt butyl material formed preponderantly of polyisobutylene resin.

4. The package configuration according to claim 1, wherein said backplate has recesses therein and said layer of desiccant is placed inside said recesses.

5. The package configuration according to claim 4, wherein said recesses each have a lid of synthetic resin film thereover for preventing said layer of desiccant from flowing out of said recesses into said empty space, said synthetic resin film being provided with small holes adapted to pass moisture present in said empty space layer into said layer of desiccant.

6. The package configuration according to claim 1, wherein said backplate has a box-like shape and edge portions having a cross section like the letter J, and said package configuration further comprises an electrically insulating synthetic resin film superposed on and adhered to the surface of said backplate opposed to the solar cell element for enhancing the resistance to surge voltage between said backplate and said solar cell element.

7. The package configuration according to claim 1, wherein said backplate has in one portion thereof a terminal recess, an electrically insulating synthetic resin film of low permeability to moisture disposed above said terminal recess, a sealing agent filling the space between said insulating film and said backplate, and said electrically conductive wires are embedded in said layer of said sealing agent where they feed through said backplate.

8. The package configuration according to claim 1, further comprising a protective film of transparent synthetic resin superposed on said first surface of said glass substrate.

9. A package configuration of a solar cell, comprising in combination:
   a glass substrate having a first surface adapted to be exposed to incoming sunlight;
   a solar cell element of a Group II-IV compound semiconductor material formed on a second surface opposite said first surface;
   a metallic backplate in spaced opposed relationship to said second surface and defining an empty space between said backplate and said second surface of said glass substrate;
   a metallic frame connecting said glass substrate and said backplate at the peripheral portions thereof;
   a synthetic resin sealing layer sealed around the inside of said frame and sealed between the peripheral portions of said backplate and said glass substrate and extending around the periphery of said empty space for isolating said empty space from the surrounding atmosphere;

a layer of desiccant disposed on said backplate and having a surface exposed to said empty space for adsorbing moisture which may penetrate said package configuration and enter said empty space; and electrically conductive wires connected to said solar cell element and extending to the outside of said solar cell for outputting electric energy generated by said solar cell element.

10. The package configuration according to claim 9 wherein said layer of desiccant is a crystalline zeolite obtained by thermally removing water of crystallization of a hydrated metal salt of synthetic crystalline aluminosilicate of the formula $M_{2/n}O.Al_2O_3.xSiO_2.yH_2O$, wherein M is a metallic cation, n is the valency of the cation, and each of x and y is a coefficient.

11. The package configuration according to claim 9, wherein said layer of sealing resin is hot melt butyl material formed preponderantly of polyisobutylene resin.

12. The package configuration according to claim 9, wherein said backplate has recesses therein and said layer of desiccant is placed inside said recesses.

13. The package configuration according to claim 12, wherein said recesses each have a lid of synthetic resin film thereover for preventing said layer of desiccant from flowing out of said recesses into said empty space, said synthetic resin film being provided with small holes adapted to pass moisture present in said empty space layer into said layer of desiccant.

14. The package configuration according to claim 9, wherein said backplate has a box-like shape and edge portions having a cross section like the letter J, and said package configuration further comprises an electrically insulating synthetic resin film superposed on and adhered to the surface of said backplate opposed to the solar cell element for enhancing the resistance to surge voltage between said backplate and said solar cell element.

15. The package configuration according to claim 9, wherein said backplate has in one portion thereof a terminal recess, an electrically insulating synthetic resin film of low permeability to moisture disposed above said terminal recess, a sealing agent filling the space between said insulating film and said backplate, and said electrically conductive wires are embedded in said layer of said sealing agent where they feed through said backplate.

16. The package configuration according to claim 9, further comprising a protective film of transparent synthetic resin superposed on said first surface of said glass substrate.

* * * * *